US009837561B2

(12) United States Patent
Levy et al.

(10) Patent No.: US 9,837,561 B2
(45) Date of Patent: *Dec. 5, 2017

(54) LASER PROCESSED BACK CONTACT HETEROJUNCTION SOLAR CELLS

(71) Applicants: David Howard Levy, Rochester, NY (US); David E. Carlson, Williamsburg, VA (US)

(72) Inventors: David Howard Levy, Rochester, NY (US); David E. Carlson, Williamsburg, VA (US)

(73) Assignee: Natcore Technology, Inc., Rochester, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/068,900

(22) Filed: Mar. 14, 2016

(65) Prior Publication Data

US 2016/0268455 A1  Sep. 15, 2016

Related U.S. Application Data

(60) Provisional application No. 62/132,881, filed on Mar. 13, 2015.

(51) Int. Cl.
*H01L 21/00* (2006.01)
*H01L 31/0224* (2006.01)
*H01L 31/18* (2006.01)
*H01L 31/0747* (2012.01)

(52) U.S. Cl.
CPC .. *H01L 31/022441* (2013.01); *H01L 31/0747* (2013.01); *H01L 31/1804* (2013.01); *Y02E 10/547* (2013.01); *Y02P 70/521* (2015.11)

(58) Field of Classification Search
None
See application file for complete search history.

(56) References Cited

U.S. PATENT DOCUMENTS

| 5,362,657 | A | * | 11/1994 | Henderson | .......... H01L 27/0605 |
| | | | | | 148/DIG. 72 |
| 5,918,140 | A | | 6/1999 | Wickboldt et al. | |
| 2010/0319769 | A1 | | 12/2010 | Birkmire et al. | |
| 2011/0023956 | A1 | | 2/2011 | Harder | |
| 2011/0183457 | A1 | | 7/2011 | Piwczyk | |
| 2013/0164883 | A1 | | 6/2013 | Moslehi et al. | |
| 2013/0171767 | A1 | | 7/2013 | Moslehi et al. | |

(Continued)

OTHER PUBLICATIONS

Hallam et al. ("Deep junction laser doping for contacting buried layers in silicon solar cells", Solar Energy Materials and Solar Cells, Jun. 2013, pp. 124-134).*

(Continued)

*Primary Examiner* — Shaun Campbell
(74) *Attorney, Agent, or Firm* — Winstead PC

(57) ABSTRACT

An interdigitated solar cell may provide a heterojunction or tunnel junction emitter and base contacts that comprise laser processed regions that electrically couple the base contact to a substrate. Methods for manufacturing such solar cells to provide interdigitated back contacts may utilize laser processing to form laser processed regions that are isolated from the emitter. Laser processing may include laser-doping, laser-firing, laser-transfer, laser-transfer doping, laser contacting, and/or gas immersion laser doping.

18 Claims, 11 Drawing Sheets

(56) References Cited

U.S. PATENT DOCUMENTS

| | | |
|---|---|---|
| 2014/0096821 A1 | 4/2014 | Chen et al. |
| 2014/0147944 A1 | 5/2014 | Kommera et al. |
| 2014/0360567 A1 | 12/2014 | Seutter et al. |
| 2015/0017793 A1 | 1/2015 | Hallam et al. |
| 2015/0040979 A1* | 2/2015 | Ravi .................. H01L 31/1804 136/256 |
| 2015/0171230 A1* | 6/2015 | Kapur ............. H01L 31/022441 438/72 |

OTHER PUBLICATIONS

Masuko et al., 40th IEEE Photovoltaic Specialists Conference, Jun. 8-13, 2014, Denver, Colorado.
Nakamura et al., 40th IEEE Photovoltaic Specialists Conference, Jun. 8-13, 2014, Denver, Colorado.
Smith et al., 40th IEEE Photovoltaic Specialists Conference, Jun. 8-13, 2014, Denver, Colorado.

* cited by examiner

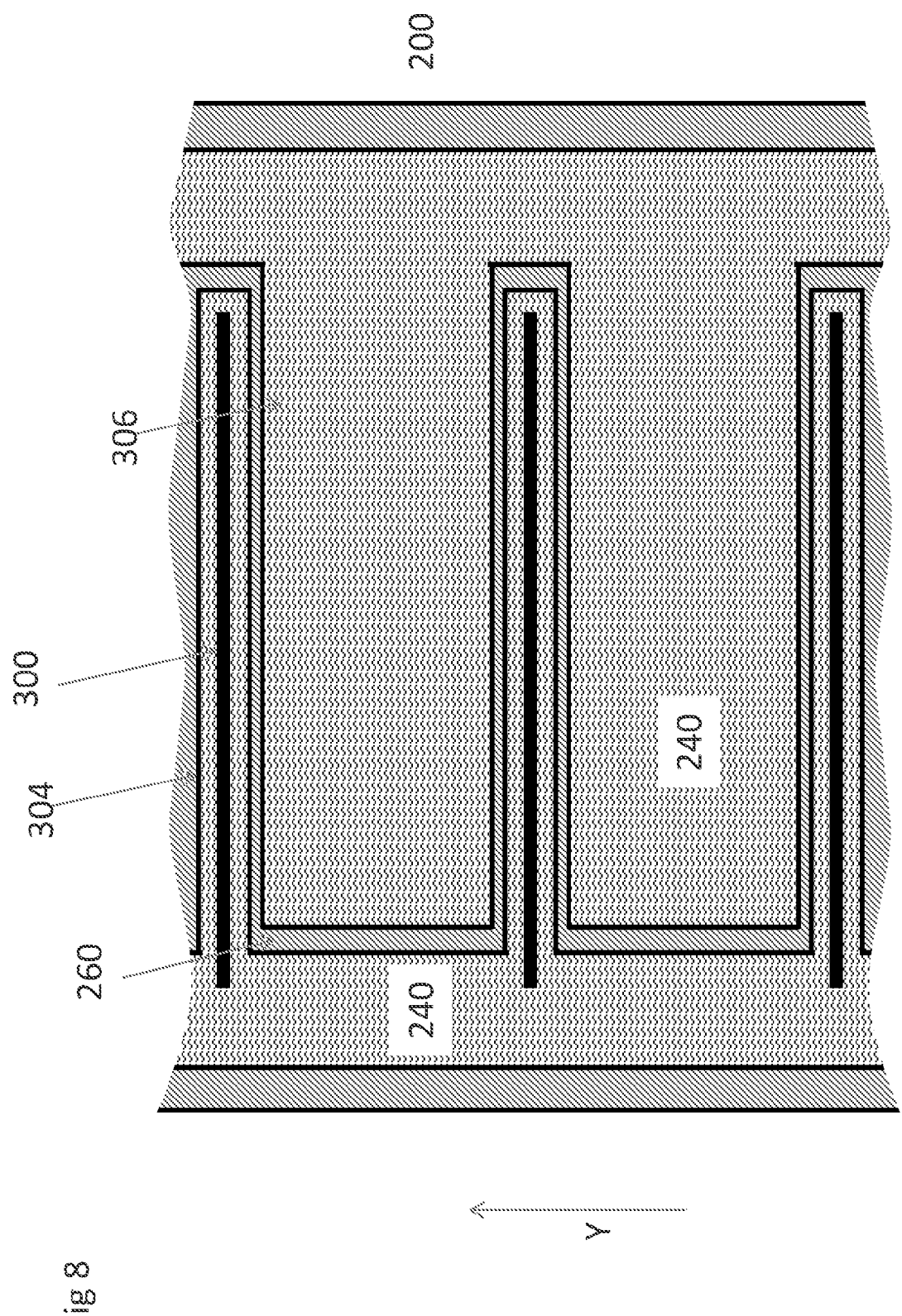

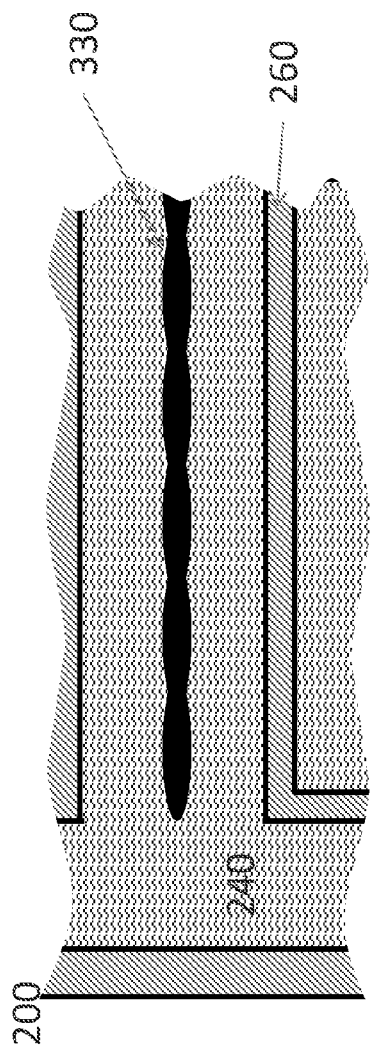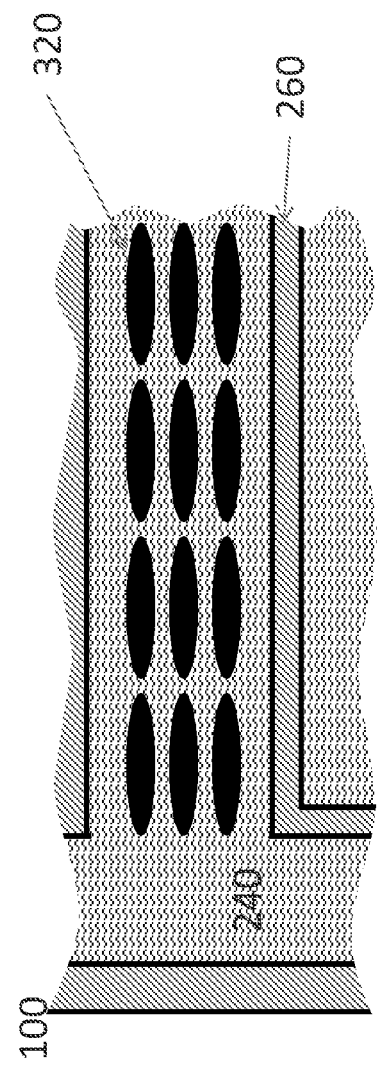

LASER PROCESSED BACK CONTACT HETEROJUNCTION SOLAR CELLS

RELATED APPLICATIONS

This application claims the benefit of U.S. Provisional Patent Application No. 62/132,881 filed on Mar. 13, 2015, which is incorporated herein by reference.

FIELD OF THE INVENTION

This invention relates to interdigitated back contact (IBC) solar cells. More particularly, to systems and methods for fabricating IBC solar cells with a heterojunction or tunnel junction emitter.

BACKGROUND OF THE INVENTION

A desirable solar cell geometry referred to as an interdigitated back contact (IBC) cell comprises a semiconductor wafer and alternating lines (interdigitated stripes) coinciding with regions with p-type and n-type doping. This cell geometry has the advantage of eliminating shading losses altogether by putting both contacts on the rear side of the wafer that is not illuminated. Further, contacts are easier to interconnect with both contacts on the rear surface.

Another desirable solar cell architecture involves the use of silicon heterojunction or tunnel junction contacts. A well-known example of such architectures is the HIT (heterojunction with intrinsic thin layer) cell structure. In the conventional front emitter form of this structure, a silicon wafer is contacted on both sides by a thin intrinsic hydrogenated amorphous silicon (a-Si:H) layer, which serves as a surface passivating layer as well as a charge carrier transport layer. On the front of the cell, a semiconductor layer doped to the opposite doping polarity of the base substrate is applied, forming a heterojunction emitter. On the rear of the cell, a semiconductor layer doped to the same doping polarity as the base substrate is applied, forming a base contact. These layers can then be contacted with transparent or metallic conducting layers to extract current from the solar cell. In the tunnel junction cell, the intrinsic a-Si:H layer is replaced with a thin high bandgap material. In the case of the heterojunction cell, charge carrier transport occurs via a band conduction mechanism in the intrinsic a-Si:H layer, while in the case of the tunnel junction cell, charge carrier transport occurs via quantum mechanical tunneling. Despite this difference, these cells operate via similar mechanisms and importantly can be manufactured in low temperature processes because they do not require dopant diffusion.

The conventional heterojunction or tunnel junction solar cells cannot achieve outstanding efficiencies because they still require front side contacts. The presence of a contact on the front side firstly reduces efficiency due to blocking or shading of the incoming light by the necessary metal grids which extract the generated current. Additionally, the presence of a front electrical contact requires that the front of the cell be simultaneously optimized for electrical, light absorption, and passivation properties, often producing a compromise which affects cell performance.

Presently, silicon solar cells with the highest efficiency are those based on combining an interdigitated all back contact structure with silicon heterojunction contacts. Panasonic recently reported obtaining a record conversion efficiency of 25.6% with such a device structure (Masuko et al., $40^{th}$ IEEE Photovoltaic Specialists Conference, Jun. 8-13, 2014, Denver, Colo.). At the same conference, Sharp reported obtaining an efficiency of 25.1% with a similar device structure (Nakamura et al., $40^{th}$ IEEE Photovoltaic Specialists Conference, Jun. 8-13, 2014, Denver, Colo.), and SunPower obtained an efficiency of 25.0% with an interdigitated back contact (IBC) silicon solar cell made using conventional diffusion processes (Smith et al., $40^{th}$ IEEE Photovoltaic Specialists Conference, Jun. 8-13, 2014, Denver, Colo.). While the processing of these high efficiency IBC solar cells were not discussed in any detail, the manufacturing costs are likely to be relatively high since the known processing techniques that could be applied in each case appears to be somewhat complicated with various masking and vacuum processing steps required.

While it is clear that back contact heterojunction emitter solar cells can produce the highest efficiencies, there is a need for improved methods for producing these cells in a manner that eliminates the expense associated with multiple process and alignment steps. Furthermore, there is a need to produce heterojunction or tunnel junction emitter back contact cells with low contact resistance.

SUMMARY OF INVENTION

In one embodiment, a heterojunction emitter back contact solar cell is formed with the emitter comprising a heterojunction and the base contact comprising a laser processed contact. In some embodiments, the laser processed contact may be laser-fired or laser-doped. In some embodiments, the laser processed contact may be formed utilizing laser transfer doping. In some embodiments, the laser processed contact may be formed utilizing gas immersion laser doping (GILD).

In yet another embodiment, a metal deposition step used to contact the emitter is combined with the metal deposition step used for the laser processed contact. In another embodiment, a metal used to contact the emitter and laser processed contact regions is patterned by a laser process, such as laser transfer of the metal in a pattern desired or laser ablation to remove undesired regions of the metal. In another embodiment, the emitter occupies 60% or more of the rear surface area of the cell.

In another embodiment, a back contact solar cell is formed with the emitter including a heterojunction or a tunnel junction, and the interdigitated metal fingers are formed by a laser transfer process. Subsequently, the base contact is formed by laser firing or doping through the base interdigitated finger.

In another embodiment, a back contact solar cell is formed with the emitter including a heterojunction or a tunnel junction, and the base contact is formed using laser firing or doping conditions that disrupt the heterojunction or tunnel junction in the vicinity of the laser-processed base contact.

In another embodiment, the laser processed contact is formed by a laser transfer doping process that simultaneously laser fires or laser dopes the contact.

In some embodiments, either a narrow line-shaped laser beam or a small Gaussian laser beam may be utilized, either of which can be temporally shaped, to either ablate, transfer a dopant, metal or other material; or to laser-dope or laser fire localized p+ or n+ contacts. The laser beam may also be utilized to deposit or pattern a conductive layer.

In yet another embodiment, a solar cell with interdigitated back contacts may be provided with base contacts and an emitter. The rear surface of the solar cell may provide a heterojunction emitter or tunnel junction emitter separated from base contacts by an isolation gap. The base contacts may provide laser processed regions where dopant or metal materials provide electrical coupling to the substrate. The laser processing results in the laser processed regions being isolated from layers of the heterojunction emitter or the tunnel junction by resulting ablation or the isolation gap. In some embodiments, the isolation gap may optionally extend through a portion or all of the doped semiconductor layer, heterojunction layer, and/or tunnel junction layer. Further, the isolation gap may optionally extend into a portion of the substrate. In some embodiments, a passivation or insulating layer may be present in between the base contact regions and the emitter region. In some embodiments, a dielectric layer may be deposited on the base contact regions. One or more metal layers may be applied to the base contact regions and emitter regions.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIG. 8 is an illustrative bottom view of a cell structure;

FIGS. 9*a* through 9*d* are illustrative bottom views of laser firing patterns.

DETAILED DESCRIPTION

Figure 1:
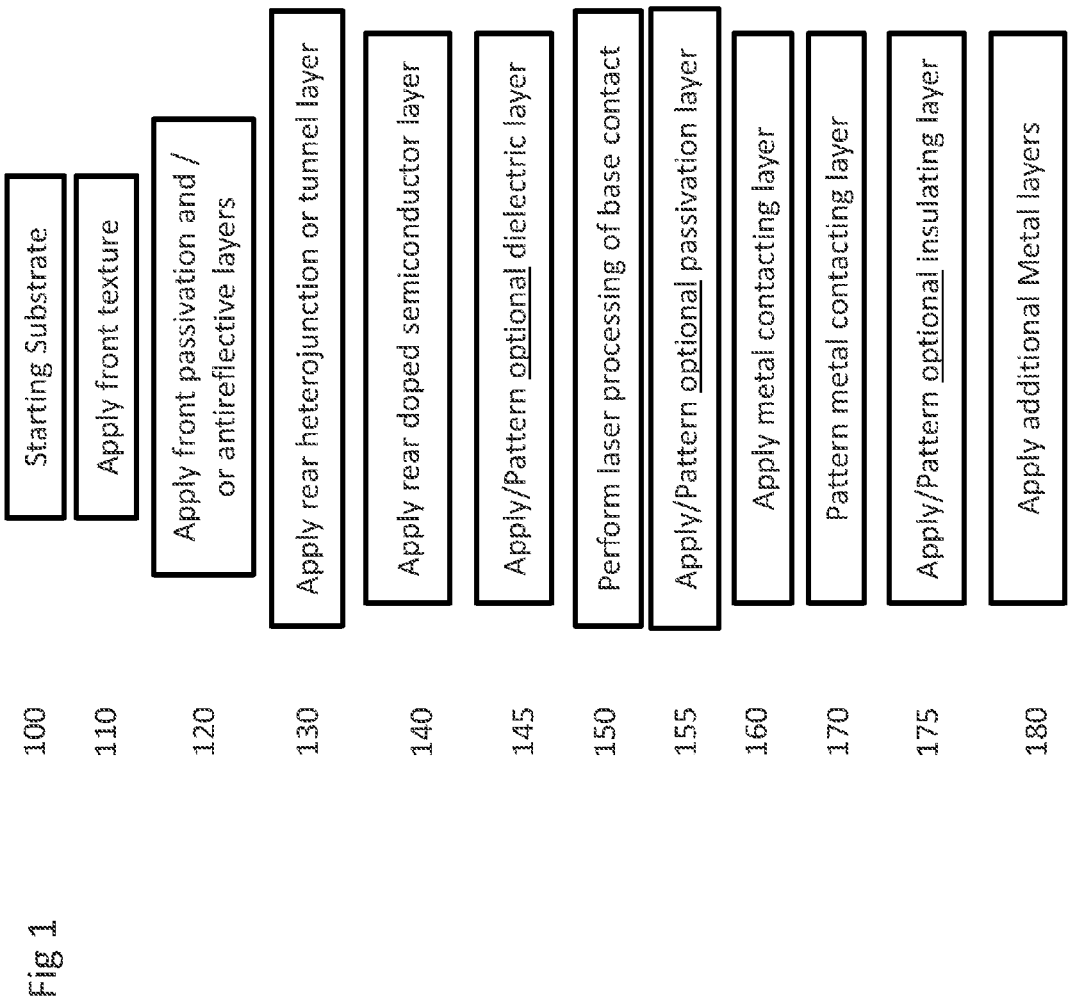
FIG. 1 is an illustrative process flow for a solar cell.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

FIG. 1 is an illustrative embodiment of a flow diagram for fabricating laser contacted heterjunction or tunnel junction solar cell. A suitable substrate (step 100) is selected and introduced into the process. The suitable substrate may be a semiconductor wafer of any convenient size or shape. Non-limiting examples of suitable semiconductors includes group IV semiconductors, such as silicon or germanium; group III-V semiconductors, such as gallium arsenide or indium phosphide; and group II-VI semiconductors, such as cadmium telluride. In some embodiments, the substrate thickness is preferably equal to or below about 1 mm. The surface of the semiconductor wafer may be polished. In some embodiments for solar cell applications, it may be preferable for the starting wafer to have a surface that is textured to promote light absorption (optional step 110). The surface texture may be applied by mechanical means, laser processes, chemical etching processes, or the like. In some embodiments for silicon wafers, the preferred surface texture may contain exposure of predominantly <111> and <110> facets, such as is obtained by treatment with basic solutions containing KOH or NaOH in conjunction with surfactants such as alcohols. In some embodiments, the surface may be chemically smoothed by treatment with various etchants. A starting wafer that has a rough texture resulting from the wafer sawing process can be chemically smoothed with hydroxide containing etchants, such as NaOH, KOH, TMAH (tetramethylammonium hydroxide), combinations thereof, or the like. The concentrations of these etchants can be greater than 10%, and etching may be performed at temperatures equal to or greater than 50° C. The resulting surface is substantially smoothed relative to the starting rough surface, but may still contain pits, depressions, or surface undulations.

As a nonlimiting example, the surface of the wafer may be textured with very fine features to produce a gradient refractive index, also referred to as a nanoscale texture or black silicon. In some embodiments, the anti-reflective etching process may be a single stage process that includes a catalytic metal and etching chemistries. In some embodiments, the anti-reflective etching process may be a multi-stage process that includes: a catalytic metal deposition stage to deposit a metal on the substrate, and an etching stage that texturizes surface(s) of the substrate to reduce reflectivity. In some embodiments, the catalytic metal deposition stage may occur utilizing a thin layer fluid process that includes steps similar to the etching stage as discussed further herein. In some embodiments, the catalytic metal may exist in a deposition fluid as a precursor that is reduced or plated on the substrate surface. As a nonlimiting example, preferred catalytic metal solutions contain a catalytic metal and a fluorine containing compound, such as hydrofluoric acid, that is dispensed and/or dispersed into a thin fluid layer on the substrate to deposit the catalytic metal on the substrate. In some embodiments, the deposition fluid is dispersed or spread out into the thin layer with a thickness of 5 mm or less. In other embodiments, the deposition fluid is dispersed or spread out into the thin layer with a thickness of 1.5 mm or less. A thickness of the thin layer of deposition fluid is controlled by controlling a separation distance between the first surface of the substrate and an opposing surface of a dispersion mechanism opposite the first surface. The deposition fluid may remain in contact with the substrate for about 5 seconds to 5 minutes for the catalytic metal deposition stage. After the catalytic metal deposition stage, the metal catalyst has been deposited on portions of the substrate, and the anti-reflective etching process may proceed to the etching stage to texturize the surface of the substrate where the metal catalyst was deposited on the substrate.

The substrate may have different surface textures on the front and rear surfaces. The front surface may be textured to promote light absorption, while the rear surface may be textured or smoothed to promote compatibility with the contacting and laser firing processes. The front surface may have textures as discussed above while the back surface may be a nominally smooth surface obtained by mechanical polishing, chemical mechanical polishing (CMP), or chemical etching. Differential textures on front and back may be achieved by any conventional means. The different surfaces may be subjected to different treatments by protecting one of the surfaces with a protective coating while immersing the substrate in a treatment bath or processing in a chamber. The substrate may be subjected to a single side process by maintaining the substrate partially immersed in a fluid, where one face is immersed and the other face is not. Alternatively, the substrate may be processed in a chamber where only one side of the substrate is treated.

The starting substrate may be highly pure and thus nearly intrinsic in doping character or may have a particular bulk doping leading it to be n-type or p-type. The presence of doping modifies the bulk resistivity of the substrate. In some embodiments, substrates have a bulk resistivity equal to or between about 0.1 to 50 ohm-cm. In some embodiments, substrates have a bulk resistivity equal to or between about 1 to 25 ohm-cm. The substrate may be an n-type doped silicon grown by the Czochralski method. The examples discussed above and herein are provided for illustrative purposes only, and it will be recognized that a suitable substrate is in no way limited to the particular examples discussed.

Front passivation layers may be applied (step 120) by any conventional means. As a nonlimiting example, the front passivation may include a process such as atomic layer deposition (ALD). The material deposited by ALD may include aluminum oxide ($Al_2O_3$) or silicon dioxide ($SiO_2$). A preferred passivation is the ALD deposition of aluminum oxide using trimethylaluminum (TMA) as a precursor. The substrate may be annealed after deposition of the ALD deposited layer to improve or alter the passivation quality. The front passivation may also be applied by exposing the substrate to oxygen at elevated temperature to produce a thermal oxide.

In some embodiments, the front passivation may be a semiconductor layer. A preferred semiconductor passivation layer is hydrogenated amorphous silicon (a-Si:H). The a-Si:H may be deposited by any conventional means, including plasma enhanced chemical vapor deposition (PECVD) or hot wire chemical vapor deposition (HWCVD). The deposition preferably takes place at temperatures ranging from equal to or between approximately 150° C. to 450° C., more preferably from equal to or between approximately 200° C. to 400° C. The a-Si:H passivation may be undoped, indicating that no intentional doping compounds are included. Alternatively, the a-Si:H passivation layer may be lightly doped by a doping compound. In some embodiments, the a-Si:H layer is relatively thin (equal to or between about 2 to 20 nm) to minimize light absorption at the front surface. The front passivation may include several layers of a-Si:H or other semiconductor materials with various doping levels. In some embodiments, a structure contains a first layer of intrinsic a-Si:H in contact with the silicon substrate and a second layer of doped semiconductor such as doped a-Si:H. These and other structures produce a front surface field to prevent charge carrier recombination at the front surface.

A rear heterojunction layer or tunnel junction layer (step 130) may be applied or formed by any conventional means on a rear surface of a substrate. A heterojunction is the interface that occurs between two layers or regions of dissimilar crystalline semiconductors. These semiconducting materials have unequal band gaps, as opposed to a homojunction with materials having equal band gaps. The heterojunction layer applied or formed in step 130 may comprise any suitable semiconductor with the appropriate band structure, mechanical and/or adhesion properties. In some embodiments, the heterojunction material is a-Si:H. The a-Si:H layer can be of any suitable thickness to promote good charge carrier transport while maintaining integrity. The thickness can be in the range equal to or between approximately 2 to 20 nm, preferably equal to or between approximately 4 to 10 nm.

A tunnel junction is a barrier, such as a thin insulating layer or large band-gap layer, between two electrically conducting materials. Electrons (or quasiparticles) pass through the barrier by the process of quantum tunneling. In other embodiments, a tunnel junction layer is applied or formed in steps 130. A tunnel junction layer may comprise any suitable insulator or large band-gap material with the appropriate band structure, mechanical, and/or adhesion properties. Nonlimiting examples of tunnel junction materials are $SiO_2$, $SiN_x$, or $Al_2O_3$. A tunnel junction may be applied by ALD, PECVD, thermal oxidation (where applicable), or chemical oxidation (where applicable). In some embodiments, the tunnel junction layer may be formed by a thermal treatment or chemical reaction of the substrate. As a nonlimiting example, a silicon substrate may be subjected to thermal or chemical oxidation to form a $SiO_2$ layer or tunnel junction layer.

A doped semiconductor layer (step 140) may be applied by any conventional means on a rear surface of the substrate below the heterojunction layer or the tunnel junction layer. A rear doped semiconductor layer may comprise any suitable semiconductor with the appropriate band structure, mechanical and/or adhesion properties. Preferred nonlimiting example of a doped semiconductor layer is doped silicon. The silicon may be amorphous, microcrystalline, or polycrystalline depending upon growth conditions. The silicon layer may be deposited by any conventional means, including plasma enhanced chemical vapor deposition (PECVD) or hot wire chemical vapor deposition (HWCVD). The deposition preferably takes place at temperatures ranging equal to or between approximately 150° C. to 450° C., and more preferably equal to or between approximately 200° C. to 400° C. Doping may be accomplished by including a chemical dopant in the deposition feed stream. Nonlimiting examples of dopant chemicals include borane, diborane, phosphine, and arsine. The dopant may be present in the feed stream at concentrations from equal to or between approximately 0.5% to 20% on a molar basis relative to the silicon precursor. Preferred concentrations are from equal to or between approximately 2% to 10%. In some embodiments, the step 140 of applying doped semiconductor layer may include patterning to provide gaps between emitter regions and base regions or to remove the doped semiconductor layer from the base regions. In some embodiments, the patterning to provide gaps discussed above may also remove a portion of the heterojunction layer or the tunnel junction layer. The patterning may involve masking, etching, or the like form a desired pattern for the doped semiconductor layer.

In embodiments providing a heterojunction, the heterojunction layer and the rear doped semiconductor may be referred to collectively as a heterojunction structure since the layers function together to produce the proper energy band characteristics in their vicinity. It shall be understood by one of skill in the art that any heterojunction structure discussed herein refers to any single or combination of layers employed to provide a heterojunction that provides the desired energy band characteristics. In embodiments providing a tunnel junction, the tunnel layer and the rear doped semiconductor may be referred to collectively as a tunnel junction structure since the layers function in order to produce the proper energy band characteristics in their vicinity. It shall be understood by one of skill in the art that any tunnel junction structure discussed herein refers to any single or combination of layers employed to provide a tunnel junction that provides the desired energy band characteristics.

In some embodiments, a dielectric layer (step 145) may be applied and/or patterned on the doped semiconductor layer. The dielectric layer may be positioned on the doped semiconductor layer in the base contact regions. The dielectric layer may be discontinuous and provide an opening or gap in the emitter region. In some embodiments, the dielectric layer may be larger than the base contact regions so that a portion of the dielectric layer extends into the region between the base contact region and/or into a portion of the emitter region. The dielectric layer may provide function(s), such as passivation or protection of the underlying regions.

Laser processing of the base contact (step 150) may be performed by one or more processes including laser firing, laser doping, laser transfer, laser transfer doping, laser-contacting, laser ablating of materials, and/or gas immersion laser doping (GILD). Laser processing generally refers to any laser processing step(s) that are utilized to produce the base contacts, and it shall be understood that laser processing may include one or a combination of steps, such as the steps listed above. Laser-firing or laser-doping may be utilized herein to refer to any laser processing where the laser beam locally disrupts or removes materials (such as a doped semiconductor layer, heterojunction/tunnel junction layer, and a portion of the substrate), and simultaneously drives a desired material (such as a dopant or metal dopant) into the substrate. Laser-transfer may be utilized herein to refer to laser processing where the laser beam transfers material(s) from a donor substrate onto a desired substrate. In some embodiments, laser-transfer may be utilized outside of the laser processing step 150 to deposit desired materials, such as metal contact layers. Laser-transfer doping may refer to utilizing the laser-transfer discussed above combined with laser-firing or laser-doping. It should be noted that the laser-doping or laser-firing may occur simultaneously with the laser-transfer, or alternatively, may be performed as distinct steps. In some embodiments, laser ablating may be a by-product of the laser processing. For example, setting of a laser can be tuned so that the laser causes the laser-processed regions to be isolated from nearby layers (e.g. doped semiconductor layer), such as by creating a small gap in between. Laser-contacting may be utilized herein to refer to any process in which the laser is used to at least partially produce a contact for the substrate. The process may include a single above described function, such as laser transfer or laser doping. Alternatively, the process may include multiple functions that occur simultaneously, serially, or through several laser treatments from one or more laser systems. Such multiple function laser contact may include a laser transfer doping process in which the laser pulse transfers materials and dopes the substrate, yielding a useful contact on the substrate.

The laser processing step 150 is performed on base contact regions to form laser-processed regions that extend through any layers present on the rear surface of the substrate (e.g. the doped semiconductor layer, intrinsic layer or insulating/large band-gap layer, and/or dielectric layer) to the substrate. This allows subsequently deposited metal layers in the base contact regions to be electrically coupled to the substrate. Further, the laser processing step 150 may also result in localized ablating of any layer(s) present to minimize or eliminate electrical contact with the laser processed regions, which improves isolation of the base contacts from the emitter.

In some embodiments of a laser processing step, a dopant source may be optionally applied to the silicon substrate and driven into the silicon during the laser pulse, which may be referred to herein as laser-firing or laser-doping. In some embodiments, the laser processing step 150 comprises laser-firing or laser-doping where the laser beam causes localized disruption of the materials on a substrate, and a dopant or metal dopant from dopant material(s) applied to the substrate is driven into the substrate during the laser pulse. As a result, a laser processed region is formed with the dopant or metal dopant that provides electrical contact with the substrate, and any doped semiconductor, heterojunction, tunnel junction, and/or other layers are removed or isolated from the laser processed regions. In some embodiments, the dopant layer may be applied by physical vapor deposition techniques, including evaporation and sputtering. In some embodiments, the dopant layer may be applied by chemical vapor deposition techniques. In some embodiments, the dopant layer may also be applied by liquid deposition techniques, including screen printing, spin coating, bead coating, or inkjet printing. The liquid dopant can be supplied at a solution or dispersion or slurry.

Figure 10:
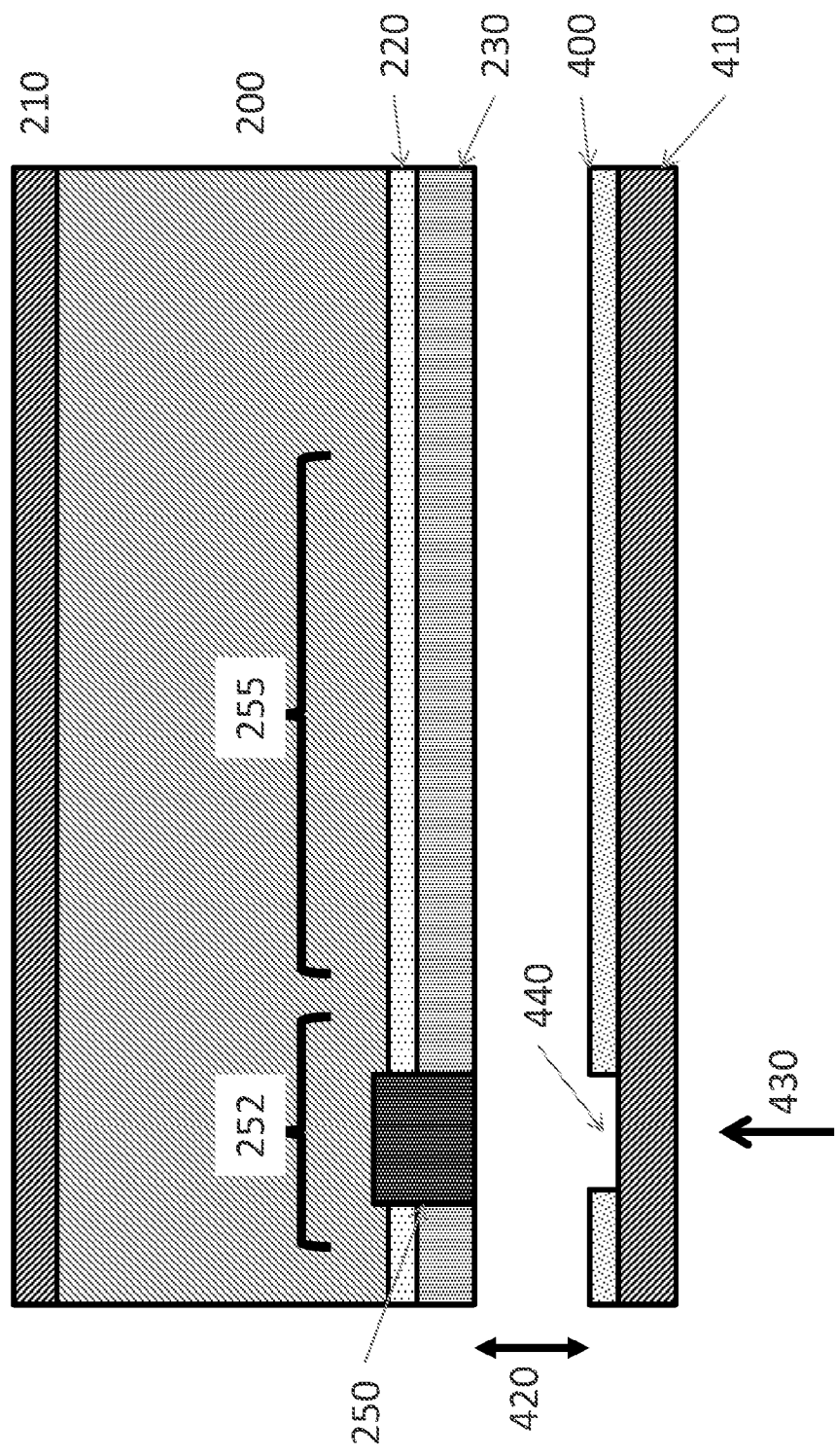
FIG. 10 shows an embodiment of a laser-transfer system.

In some embodiments of the laser processing step, the dopant may be supplied from an donor substrate, which may be referred to herein as laser-transfer. FIG. 10 shows a nonlimiting embodiment of a laser-transfer system. Substrate (200), anti-reflection layer (210), heterojunction/tunnel junction layer (220), and doped semiconductor layer (230) may correspond to layers discussed in other embodiments discussed further below. A coating (400) is present on the surface of a donor substrate (410). The donor substrate is maintained at a distance or gap (420) from the substrate (200), which is the substrate that will receive the material(s) to laser-transferred. The distance or gap (420) between the donor substrate (410) and the nearest layer (e.g. doped semiconductor 230) of substrate (200) may range from being in direct contact with each other to 0.5 mm. A laser beam (430) directed through the donor substrate (410) toward the main substrate (200) has the effect of vaporizing the coating (400) in a region (440) exposed to the beam and transporting the desired material to coat the main substrate. In some embodiments, the power from the laser pulse (430), or additional pulses, may serve to incorporate the desired material or a derivative thereof into the main substrate (200). The coating (400) may be a dopant material or a derivative thereof, so that the above laser-transfer process results in a doped region (250) in a base region (252) separated from the emitter (255). In some embodiments, the coating (400) may be a semiconductor, conductor or precursor thereof. In such cases, the laser transfer process may produce regions or desired properties on the substrate (200), such as regions of high conductivity. In contrast to laser-firing where dopant or metal dopant materials are present on the substrate, laser-transfer causes a desired material(s) from a donor substrate (410) to migrate onto a donee or main substrate (200). Laser-transfer can be taken even further to cause doping of the main substrate as well, which may be referred to herein as laser-transfer doping, such as where the dopant is driven into a certain depth of the donee substrate. In some embodiments, the laser-transferring of materials and the doping may occur simultaneously. This 'doping' associated with the laser-transfer process is akin to the laser-doping or laser-firing discussed above (except the dopant being supplied from a donor substrate), but is referred in this section discussing laser-transfer as 'doping' for the sake of clarity. In other embodiments, the laser-transferring and doping may be separate, individual processing steps. The laser-transfer approach utilizes a rapid interaction between a laser and a non-transparent thin source film deposited on a transparent plate or donor substrate (e.g. glass or quartz), which is placed in close proximity (e.g. about several microns) to a receiving substrate. The source materials supplying the dopant or metal dopant may be applied to the donor substrate by any suitable approach or any of the approaches mentioned above. The donor substrate may also include thin flexible glass and/or polymer films and other materials transparent to the laser radiation.

The donor or transfer substrate of the laser processing system can be coated with multiple layers depending on the application. As a nonlimiting example, the laser transfer substrate may be first coated with a thin easily evaporated material (e.g. a-Si:H) to act as a release layer for a refractory material (e.g. Mo) or a transparent material (e.g. $SiO_2$) deposited on the a-Si:H. Another example involves first depositing a layer of Ni on the laser transfer substrate followed by a layer of Sb so that the laser will transfer Sb for $n^+$ doping and Ni for a low-resistance nickel silicide contact.

The laser processing system can utilize multiple pulses in addition to temporally shaped pulses. In some embodiments, a laser beam may be temporally shaped with an initial energy density over a first time period to efficiency transfer the dopant material from a donor plate to the substrate. Further, the laser beam may also be tuned to disrupt the heterojunction or tunnel junction structure to cause delamination. In further embodiments, the laser beam may be transitioned to a second energy density that is lower that the initial energy density for a second time period to locally melt the heterojunction or tunnel junction structure and to allow a dopant to diffuse into the substrate. In further embodiments, the laser beam may be transitioned to a third energy density that is lower than the second energy density for a third time period to anneal the localized laser-processed region. As a nonlimiting example, the first pulse could comprise a first section of relatively high energy density (e.g. ~1 $j/cm^2$) over a predetermined time period (e.g. 10 ns), and then a slowly decreasing section where the energy density decreases, such as from equal to or between approximately 0.7 to 0.1 $J/cm^2$ over a predetermined period of time (e.g. 400 ns). A second pulse to the same location might then be applied approximately a set period of time (e.g. 10 µs) later (100 kHz repetition rate) with an energy density ramping up (e.g. ~0.3 $J/cm^2$) over a fixed period of time (e.g. 10 ns). The second pulse may then slowly decrease (e.g. 0.05 $J/cm^2$) over a predetermined period of time (e.g. 500 ns) to further anneal the treated region. The wavelength of the laser beam can be in the IR (e.g. 1064 nm) for most applications, but a laser beam operating in the green (532 nm) can also be used and will more effectively heat just the top few µm of an exposed Si surface. The IR beam will initially heat the Si wafer to a depth of a few hundred µm, but as the laser rapidly heats up the Si locally, the absorption coefficient in the IR increases rapidly and the heating becomes localized near the surface region.

In some embodiments, a GILD or Gas Immersion Laser Doping process may be utilized in the laser processing step 150, where the dopant is supplied in vapor form to a chamber above the substrate such that the dopant vapor is in gaseous communication with the substrate. The gaseous dopant or a byproduct is incorporated into the substrate during the laser pulse. Gaseous source(s) can be any material containing a dopant atom with sufficient volatility, including, but not limited to, $POCl_3$, $PCl_3$, $PH_3$, $BH_3$, $B_2H_6$, arsine, and trimethylaluminum.

The various laser processes discussed above may utilize spatially and/or temporally shaped laser beams. In some embodiments, the systems or methods discussed herein may have the following elements: (1) supply of dopants by a laser process; (2) dopants supplied by the laser process to avoid heating of the wafers to perform dopant diffusion; and/or (3) an interdigitated back contact (IBC) cell. The use of line beams is a particularly attractive way to make an IBC cell since the electrodes of the IBC are thin lines, and thus can be patterned with single or reduced number of laser pulse exposures. In some embodiments, the combination of (1)-(3) above may be utilized with line and/or temporal shaping. In some embodiments, the laser beam can be spatially shaped into a narrow line-shaped laser beam or into an array of small diameter Gaussian laser beams (e.g. ≤20 µm or ≤10 µm). Line-shaped laser beams with widths ≤10 µm exhibit little laser-induced damage, while conventional circular Gaussian laser beams (e.g. with diameters of ~30-130 µm) exhibit microcracks and dislocations. Small diameter (≤20 µm or ≤10 µm) Gaussian laser beams are also less likely to exhibit extended defects, such as microcracks and dislocations due to the fact that only a very small region of Si is melted and recrystallized. In some embodiments, one or an array of Gaussian beams may be utilized, where the Gaussian beams may be circular and/or each of the Gaussian beams has a diameter of 30 microns or less. In some embodiments, a laser beam that is narrow and line-shaped may be utilized. Further, the width of the laser beam may be 20 microns or less.

The temporal pulse shape can be selected for the purposes of laser transfer of material, laser ablation or disruption of dielectric passivation layers, laser melting of selected localized regions of the Si wafer, laser doping of the melted Si regions with the appropriate dopant atoms, laser firing of contacting metals through the dielectric passivation layers and/or laser annealing of the localized treated regions on the Si wafer. Generally, laser transfer of material requires relatively short pulses (e.g. few ns to few tens of ns), while laser annealing requires relatively long pulses (e.g. 0.1 µs to several µs). The pulse duration for laser doping will depend on the dopant depth desired and can vary from tens of ns to hundreds of ns. In some embodiments, the dopant penetration depths are from 0.02 µm to 1 µm, preferably 0.1 µm to 0.5 µm. As a nonlimiting example, a laser process which combines laser transfer, disruption of the dielectric passivation, melting, doping and annealing of the Si in a localized region might employ a line-shaped beam (e.g. 8 μm wide and 1 cm long) with the following temporally shaping: the pulse starts with an initial energy density (e.g. ~1 J/cm$^2$) over several ns to transfer the dopant material (e.g. Al) to the substrate (e.g. Si surface) and disrupt the dielectric passivation, if present (e.g. 5 nm of ALD Al$_2$O$_3$/90 nm of PECVD SiO$_x$ on the rear surface); the energy density then falls (e.g. ~0.5 J/cm$^2$) over a set period of time (e.g. ~50 ns) to locally melt the substrate surface and diffuse in the dopant. Then the pulse energy density decreases (e.g. 0.5 to 0.1 J/cm$^2$) over time (e.g. ~400 ns) to anneal the localized region of substrate surface.

As nonlimiting examples, dopant materials may be any suitable n- or p-type material, Al, Sb, Group III or V element, or the like. In the laser-transfer process, the dopant atom is introduced on a donor substrate containing or coated with a dopant material including the donor atom. In a laser-firing process, the dopant is included as a metal or dopant material, respectively, on the substrate to be fired. In a GLID process, the dopant is provided in vapor form. The dopant material may be a pure form of the dopant, such as but not limited to coatings of the group III or group V atoms. Alternatively, the dopant material may be a compound containing the dopant, such as but not limited to an oxide, nitride, or chalcogenide of the donor. The dopant material may also be composed of a host material containing the dopant, such as hydrogenated amorphous silicon heavily doped with the dopant. Concentration of the dopant in the host material may be greater than 0.5%, preferably greater than 2%. The spacing of the interdigitated fingers in the laser-transferred line-contact IBC cells can be made relatively small (e.g. 100-300 microns), so that the lateral resistance (electrical shading) in the device is small.

In some embodiments, the laser processing step 150 may be utilized to remove materials by causing laser ablation or delamination due to localized heating, such as to create an isolation gap or the remove portions of a layer that are not desired in base contact regions. In some embodiments, processing conditions of a laser doping system during the laser processing step 150 may be tuned to for this remove materials. In some embodiments, the laser doping system may be tuned to remove a portion or all of a doped semiconductor layer, intrinsic layer or insulator/high bandgap layer, and/or substrate in a region between the base contact and emitter to create an isolation gap. In some embodiments, the laser doping system may be tuned to remove a doped semiconductor layer in the base contact regions.

In some embodiments, a passivation layer (step 155) may be optionally be applied and/or patterned on the doped silicon layer. The passivation layer may be positioned on the doped silicon layer between the base contact and emitter regions to provide electrical isolation. While the passivation layer step 155 is shown before application of the metal contacting layer in step 160, in other embodiments, the passivation step may optionally be performed after the metal contacting layer step 160.

A metal contacting layer (step 160) may be applied by any conventional means. While application of the metal contacting layer (step 160) is shown after performing laser processing of the base contact (step 150), in other embodiments, the application of the metal contacting layer may be performed before the laser processing step, such as when laser-firing is desired to drive the applied metal into the substrate, or combined with the laser processing step. Nonlimiting example of the means of deposition may include physical vapor deposition techniques such as vacuum evaporation or sputtering, chemical bath techniques such as electroplating or electroless plating, and liquid techniques such as screen printing, bead coating, and inkjet printing. The metal contacting layer may include any suitable metal with sufficient conductivity and contact conductance to allow current extraction from the cell. Nonlimiting examples include aluminum, silver, copper, nickel, gold, and antimony. The metals may be present as alloys or two or more metals or as multilayer structures of two or more metals. The alloy or multilayer structures may be used to promote adhesion, or to simultaneously provide a doping source. Nonlimiting examples of multilayer structures may include aluminum and silver, or antimony and silver.

The metal layers may be annealed after deposition to promote various properties including increased conductivity or improved contact conductance. Anneals may be performed at temperatures ranging from equal to or between 50° C. to 500° C., preferably equal to or between 100° C. to 400° C. Nonlimiting examples of anneal environments may include air, oxygen, nitrogen, mixtures of an inert gas and hydrogen. The anneal may be performed at constant temperature or at a variety of temperatures through processes of temperature holds and/or ramps. The temperature treatments may occur in rapid thermal processing environments such as a rapid thermal processing chamber or a belt furnace. In some embodiments, the metal layer and/or anneal may be performed using laser processing. The laser processing may be applied to a portion of the substrate. The laser processing may have variations in focus size, intensity, and/or residence time at a particular substrate location in order the yield useful heating and cooling profiles for the anneal.

If necessary, patterning of the metal layers (step 170) can be performed after application of the metal contacting layer in step 160.

In some embodiments, an interdigitated finger pattern can be formed by using a line-shaped laser beam to deposit a seed layer in a desired pattern, which may be plated with a highly conductive metal. In some embodiments, the seed layers could then be plated with a metal, such as Ni, Ti, or the like. Further, this may be optionally followed by plating with a more conductive metal, such as Al, Ag, Cu, or the like, to form a highly conductive interdigitated finger pattern. Subsequent to the laser transfer process, the solar cell can be annealed at moderate temperatures (200-450° C.) to improve the electrical properties of the contacts by promoting silicide formation and inducing atomic hydrogen motion from the PECVD SiO$_x$:H into the Si to passivate any laser-induced defects.

In some embodiments, and interdigitated finger pattern can be formed by selectively removing metal from the deposited metal layer. The deposited layer may be in contact with both the heterojunction emitter and the laser processed base contacts. Patterning may be performed by using a patterned resist to cover or protect portions of the metal layer while exposing the metal layer to an etching environment which attacks areas that are not protected. The resist may be a photoresist which is patterned by exposure to radiation. The resist may be a laser ablatable resist, which can be patterned by direct action of a laser beam or other high intensity light source. Laser ablatable resists include polymers with the necessary decomposition properties. The metal layer may also be patterned by direct ablation of the metal using a laser beam or other high intensity light source.

In some embodiments, an insulating layer (step 175) may be applied and/or patterned into gaps in the metal contacting layer. The insulating layer may be present in the gaps in the metal contacting layer and on top of the metal contacting layer. The portion of the insulating layer on metal contacting layer in the emitter region may allow subsequent metal deposited for the base contact to extend over the emitter region without making electrical contact with the emitter. This allows any subsequent additional metal layers (e.g. 270, FIG. 3) for the base and emitter to provide approximately the same width at the bottom most or exposed portion of the additional metal layers.

Additional metal layers may be applied (step 180) for functions, such as, but not limited to improving the conductance of the metal contact and protecting the metal contact from the environment. Nonlimting preferred methods of applying the additional metals include electroplating, electroless plating, and screen printing.

After step 180 the cell may receive additional processing such as annealing, encapsulation, and other protective or passivation measures.

The substrate is optionally cleaned at any point in the process as desired or required. Cleaning of the substrate may be done by solution means, including, but not limited to, treatments with acids, bases, and oxidizing chemistries. Nonlimiting examples of suitable cleaning solutions include the RCA process, involving exposure to at least (1) a solution including HCl and $H_2O_2$; (2) a solution including $NH_4OH$ and $H_2O_2$; and (3) a solution including HF. The exposure to cleaning solutions can include exposure to any combination of them in any suitable order. Cleaning can also include other solution exposures, such as the Piranha etch, comprising $H_2SO_4$ and $H_2O_2$, or solvent exposures, or cleaning in water. Useful solvents include alcohols, ketones, hydrocarbons, or halogenated solvents. Cleaning can also involve dry processes. These include ozone exposures, corona discharge treatments, plasma treatments, or the like. The treatments may be intended to clean the surface; however, it may be useful to combine cleaning with treatments that etch the surface.

It should be recognized that the order of the steps shown in FIG. 1 may be modified as necessary in other embodiments to achieve high performing cells, such as to provide various illustrative embodiments discussed further herein. It shall be understood that the following illustrative embodiments of solar cells with IBCs discussed below with reference to the figures are nonlimiting examples of solar cells that may be fabricated utilizing the process discussed with reference to FIG. 1.

Figure 2:
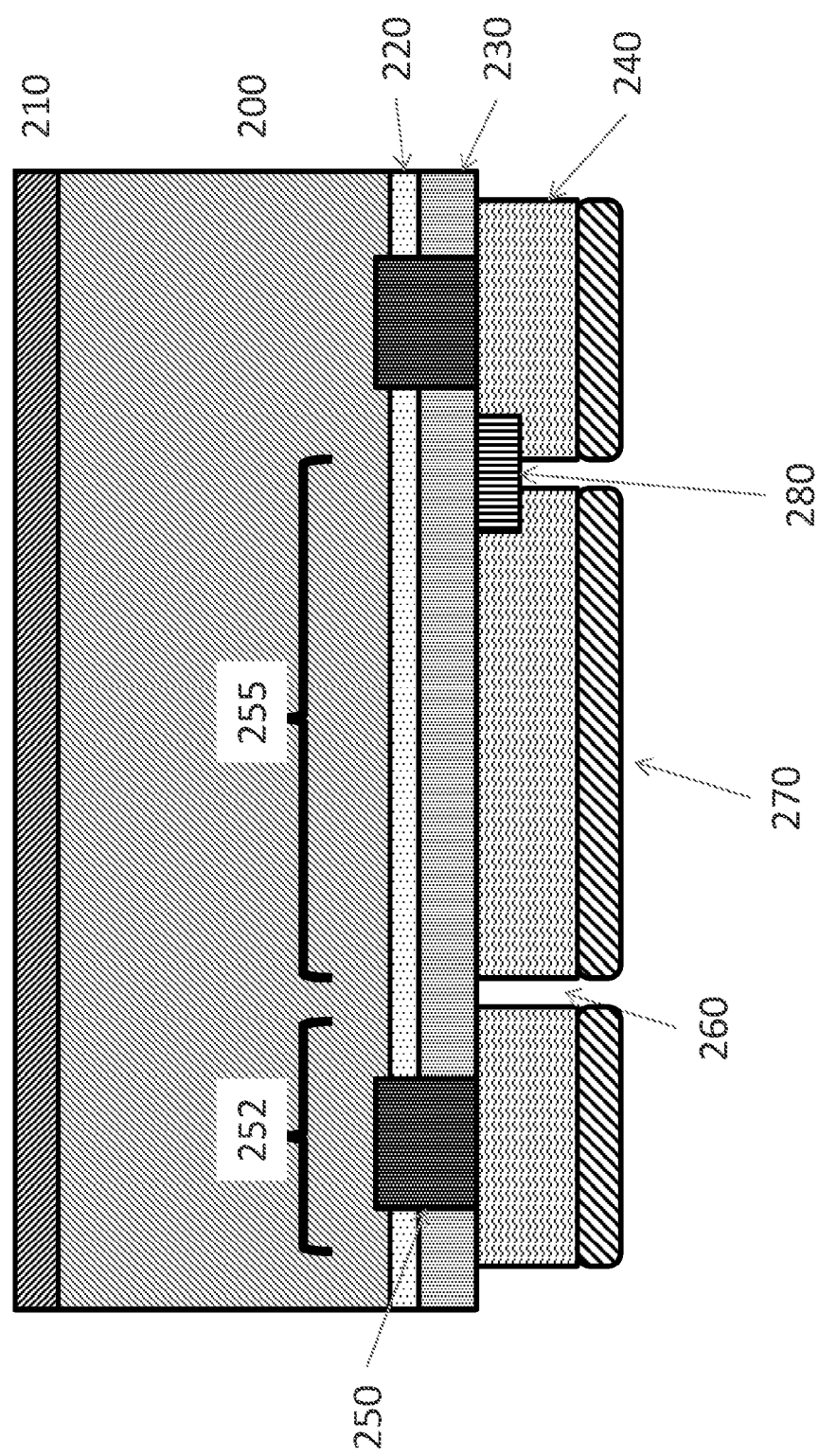
FIG. 2 is an illustrative side view of a cell structure with metal contact isolation.

FIG. 2 is an illustrative embodiment showing a side view of a solar cell with an IBC, which is formed by the fabrication process discussed above. A substrate (200) has a passivation and antireflection structure (210) on its front surface. In some embodiments, the back surface contains a heterojunction including an intrinsic or heterojunction layer (220) on the rear surface of the substrate and a doped semiconductor layer (230) below. The intrinsic layer (220) may be any suitable semiconductor, such as a-Si:H. The intrinsic or heterojunction layer (220) and doped semiconductor layer (230) collectively may be referred to as a heterojunction structure. In other embodiments where a tunnel junction is desired, a tunnel junction layer (220) and doped semiconductor layer (230) below may be substituted on the rear surface of the substrate, and the tunnel junction layer may be an insulator layer of insulating material or large band-gap layer of a material with a large band-gap. Nonlimiting examples of suitable tunnel junction materials may include $SiO_2$, $SiN_x$, or $Al_2O_3$. In the case of a tunnel junction, tunnel junction layer (220) and doped semiconductor layer (230) collectively may be referred to as a tunnel junction structure.

After the heterojunction (or tunnel junction) layer (220) and doped semiconductor layer (230) are formed, laser processed regions (250) are fabricated to penetrate through the heterojunction layer (220) and doped semiconductor layer (230) to form part of a base contact (252). The laser processing may cause the laser processed regions (250) to be electrically isolated from the heterojunction/tunnel junction layer (220) and doped semiconductor layer (230). Electrical isolation of the laser processed regions (250) may also occur naturally from the properties of the adjacent layers. As a non-limiting example, the doped semiconductor layer (230) may be constructed with sufficiently low lateral conductivity that the laser processed region (250) is effectively isolated from the majority of the heterojunction or tunnel junction structures. The laser-processed doped regions (250) may also be tuned for a minimum penetration into the silicon substrate 200. This minimum penetration may include a penetration through the doped semiconductor layer (230) and just beyond the intrinsic layer (220). A metal layer (240) is applied and/or patterned on the doped semiconductor layer (230) to provide regions in electrical communication with the base contact (252) and regions in contact with heterojunction/tunnel junction layer (220) and doped semiconductor layer (230) that form the actual emitter (255). The metal layer is separated between base contact (252) regions and emitter (255) regions by isolation gaps or openings (260) that provides isolation between the base and emitter contact structures. In the embodiment shown, the isolation gap extends to, but not through, the doped semiconductor (230) region. As utilized herein, discussion of the electrical 'isolation', or simply isolation, of the base and emitter shall be understood to indicate that electrical current flow between base and emitter is kept within a range of values that do not substantially harm the device performance. In some embodiments, this electrical current flow may be associated with the shunt current. Isolation or electrical isolation may indicate that the shunt current between the base and emitter is equal to or less than 20 $mA/cm^2$ during cell operation, or more preferably equal to or less than 10 $mA/cm^2$. Alternatively, in other embodiments, the isolation or electrical isolation may be characterized by the resistance between the base and emitter. For example, isolation or electrical isolation may be indicated by a resistance between the base and emitter that is equal to or greater than 20 ohm-$cm^2$, or more preferably equal to or greater than 100 ohm-$cm^2$. Without being bound by theory, it is believed that the laser processing may result in an advantageous disruption of layers comprising the heterojunction (or tunnel junction) structure, thus aiding in producing good isolation. An optional extra metal layer (270) positioned on metal layer (240) is illustrated, which like the metal layer provides gaps or openings in between base contacts (252) and the emitter (255). In some embodiments, the doped semiconductor layer may be treated in regions such as the isolation gap (260) to modify its electrical properties to a reduced conductivity or nonconductive state. The treatments may include locally heating with a laser or other high intensity light sources, chemical, or plasma treatments. A non-limiting example is treatment of the exposed area (260) of the semiconductor layer with a laser beam and/or chemical environment in order to reduce the conductivity of the layer in that exposed region. This approach can improve the isolation between base and emitter contacts. In some embodiments, an optional passivation or protection layer (280) may be present on the doped semiconductor layer (230) between the base contact (252) regions and emitter (255) regions. The passivation or protection layer can be deposited prior to the metal deposition (as shown) or after the metal deposition.

Figure 3:
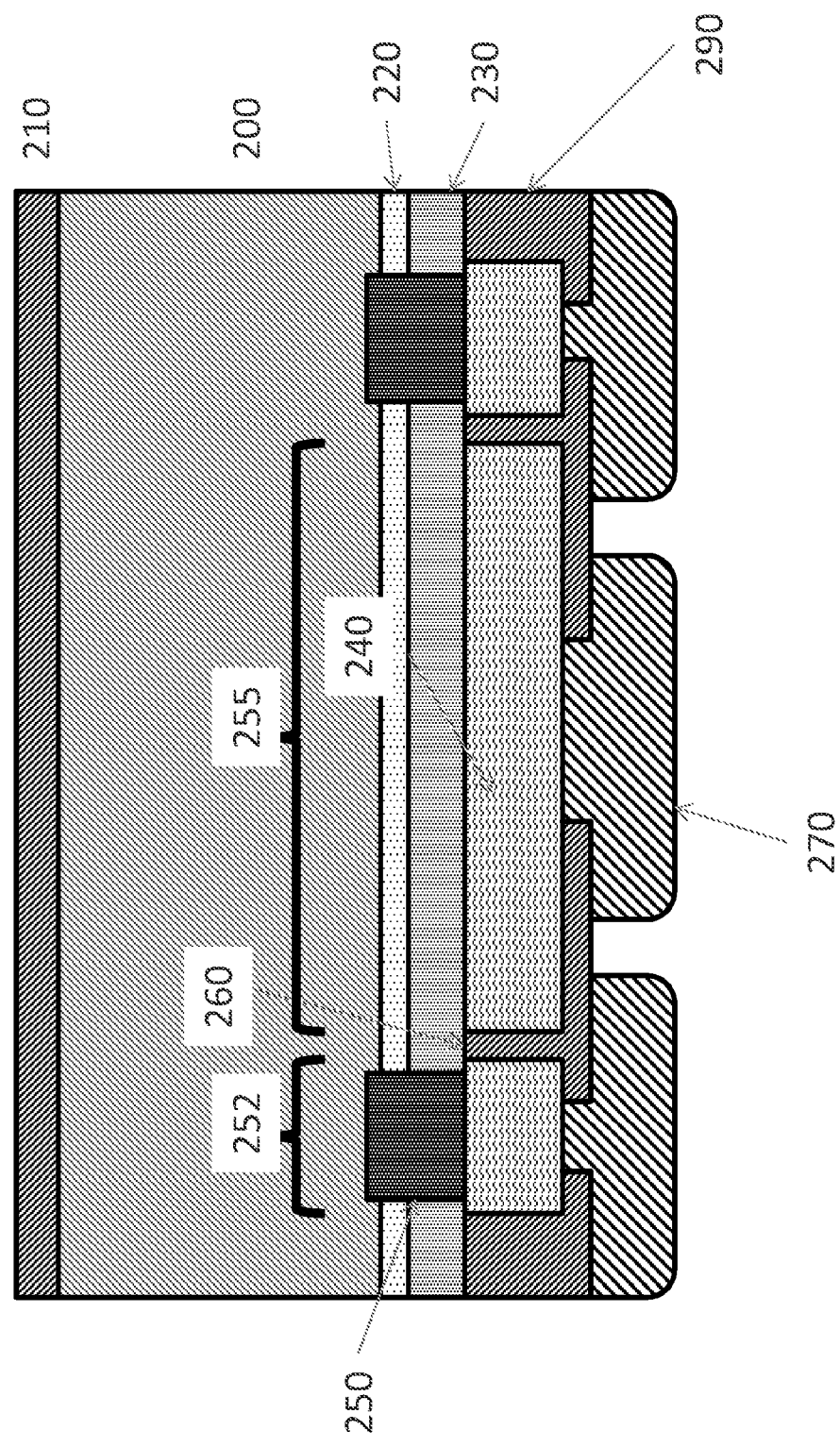
FIG. 3 is an illustrative side view of a cell structure with metal contact isolation and additional patterned metal contacts.

FIG. 3 is an illustrative embodiment showing a side view of another embodiment of a solar cell with an IBC formed by the fabrication process discussed previously. The structure, arrangement, and process for providing the components of the solar cell may be identical or similar to those discussed above for FIG. 2, except as discussed further below. In some embodiments, it may be desirable to maximize the width of the emitter region (255) at its widest point. In order to maintain low series resistance, the optional extra metal layer (270) can be patterned with the aid of an insulating masking layer (290) in order to permit the dimensions of the exposed width of the extra metal layer on both the base (252) and emitter regions (255) at their respective widest points to be similar. Insulating masking layer (290) may be applied and patterned into the isolation gap (260) and over a portion of the metal layer (240) in the base (252) and emitter regions (255). In one embodiment, the width of the extra metal layer (270) at its widest point over the emitter region (255) is within +/−40% of the width of the extra metal layer at its widest point over the base region (252). The insulating masking layer (290) provides isolation of the base (252) and emitter regions (255). Insulating masking layer (290) fills the isolation gap (260) and covers a portion of the metal layer (240) in the emitter region (255), thereby allowing the extra metal layer (270) for the base contact to lie over regions of the emitter contact without making electrical contact with the emitter. Insulating masking layer (290) may also cover a portion of the metal layer (240) and fill space unoccupied by the metal layer on a side of the base contact (252) that is opposite the emitter region (255). The insulating masking layer can be any insulating material including inorganic insulators, such as $SiO_2$, $SiN_x$, or $Al_2O_3$, or organic insulators such as polymers. The insulating masking layer can be patterned by printing, material transfer, or selective deposition prior to deposition of the extra metal layer (270). The insulating masking layer can be patterned by photolithography or application of a resist material, and can itself be a photoresist or other light or radiation sensitive material.

Figure 4:
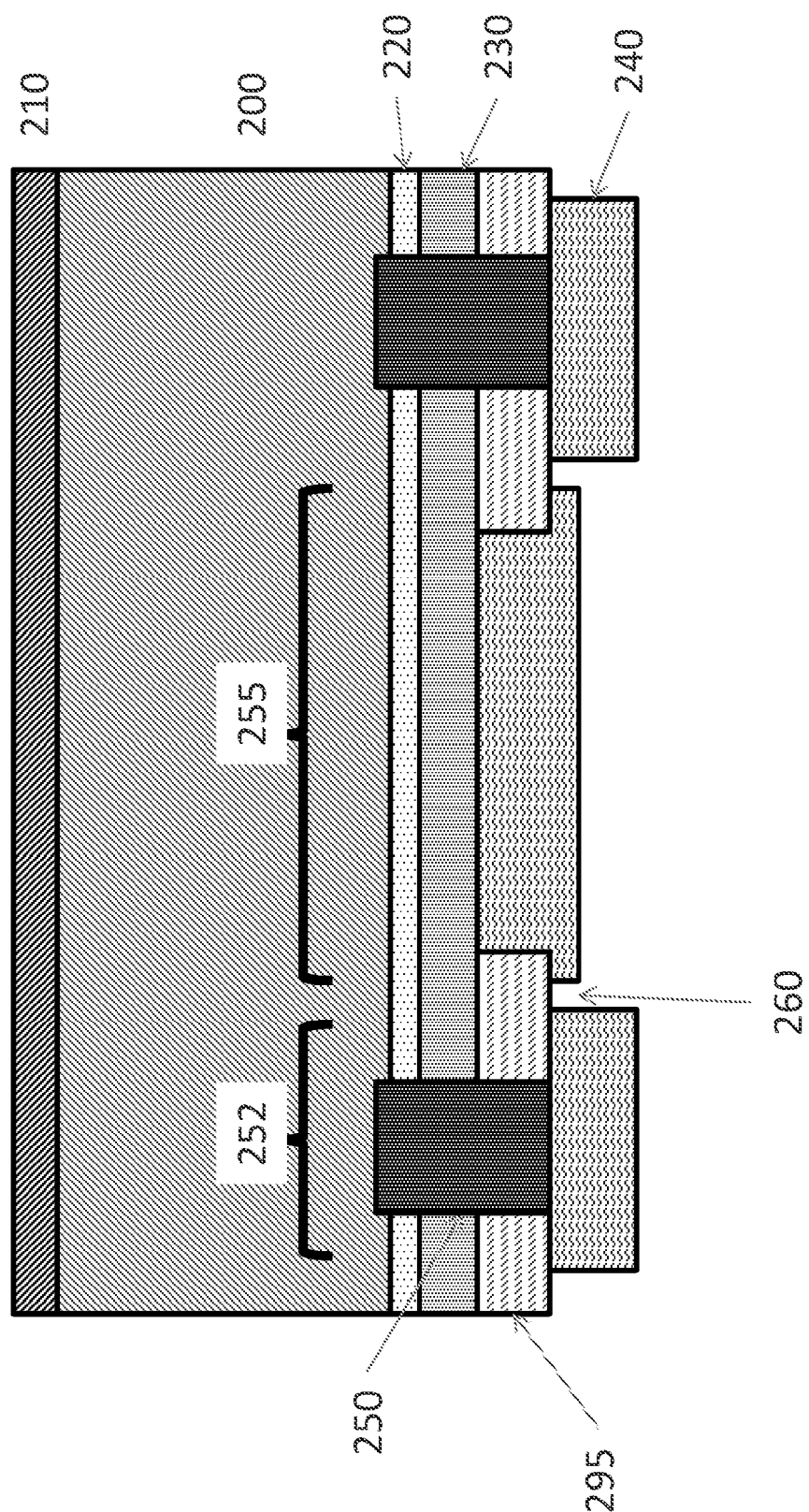
FIG. 4 is an illustrative side view of a cell structure with base contact laser firing through a dielectric layer.

FIG. 4 is an illustrative embodiment showing a side view of another embodiment of solar cell with an IBC formed by the fabrication process discussed previously. The structure, arrangement, and process for providing the components of the solar cell may be identical or similar to the embodiments discussed above, except as discussed further below. In some embodiments, the base regions (252), particularly on the doped semiconductor layer (230), may be covered with a dielectric layer (295) prior to laser processing. In some embodiments, the dielectric layer (295) may cover a portion of the base (252) regions. Alternatively, the dielectric layer (295) may extend past the base regions in one or more directions and may extend over portions of the emitter region (255). During solar cell operation, portions of the metal (240) that are in contact with the base laser processed regions (250) will develop a potential relative to the doped semiconductor layer (230). This potential may allow injection or extraction of charge carriers throughout the contact regions between base contacted metal (240 in contact with 250) and the doped semiconductor layer (230), resulting in a loss of current. An insulator, such as dielectric layer (295), that substantially occupies the possible contact area will diminish or prevent this loss of current. In the embodiment shown, the laser doped regions (250) are formed by laser processing step performed after the deposition of the dielectric layer (295) and extend through the dielectric layer and other layers present on the rear surface to the base (252) regions of the substrate (200). The portion of metal layer (240) that forms the base (252) contact (e.g. corresponding to (304) in FIG. 9a) are deposited on the dielectric layer (295) and connects to the laser doped regions (250) while having less contact or no contact with the doped semiconductor layer (230).

Figure 5:
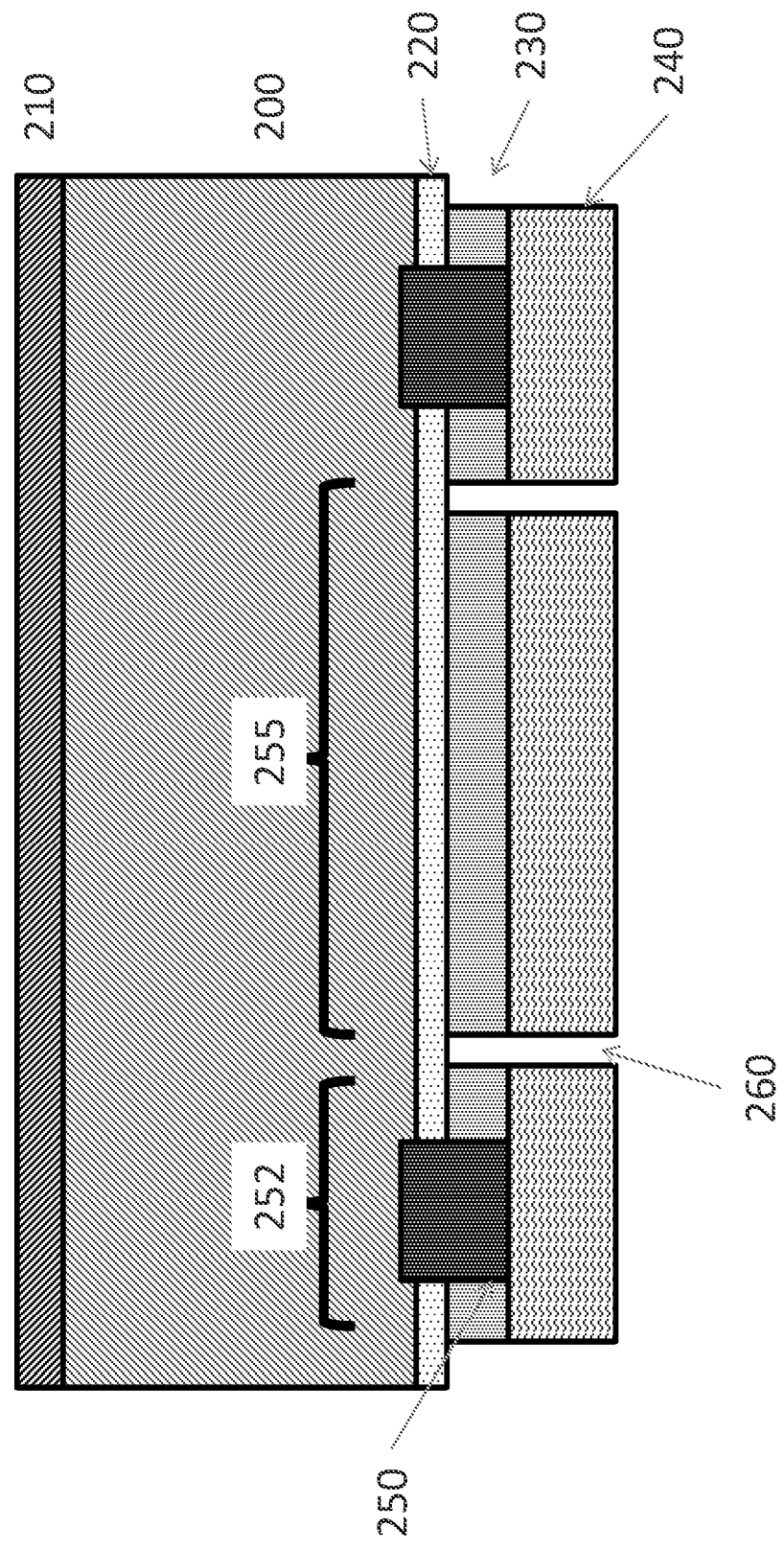
FIG. 5 is an illustrative side view of a cell structure with metal contact and doped semiconductor layer isolation.

FIG. 5 is an illustrative embodiment showing a side view of an embodiment of a solar cell with an IBC formed by the fabrication process discussed previously. The structure, arrangement, and process for providing the components of the solar cell may be identical or similar to the embodiments discussed above, except as discussed further below. The device shown is similar to that of FIG. 2, except that the contact isolation between base region (252) and emitter (255) provided by isolation gaps (260) extends through the doped semiconductor layer (230) to provide additional electrical isolation between the emitter and the base contact structures. In some embodiments, the process to etch substantially though the doped semiconductor layer (230), while leaving the intrinsic layer (220) substantially intact, to form isolation gaps (260) may be performed after deposition of the doped semiconductor layer and can include a wet etch process or a dry etch process. The process can include a selective etching chemistry that etches the doped semiconductor layer at a higher etch rate than the intrinsic semiconductor layer. The materials selected as the doped semiconductor layer and intrinsic layer may be chosen to enhance the selective etching of one layer over the other. In other embodiments, the isolation gaps (260) may be formed during laser processing by ablating the doped semiconductor layer (260) where the isolation gaps are desired.

Figure 6:
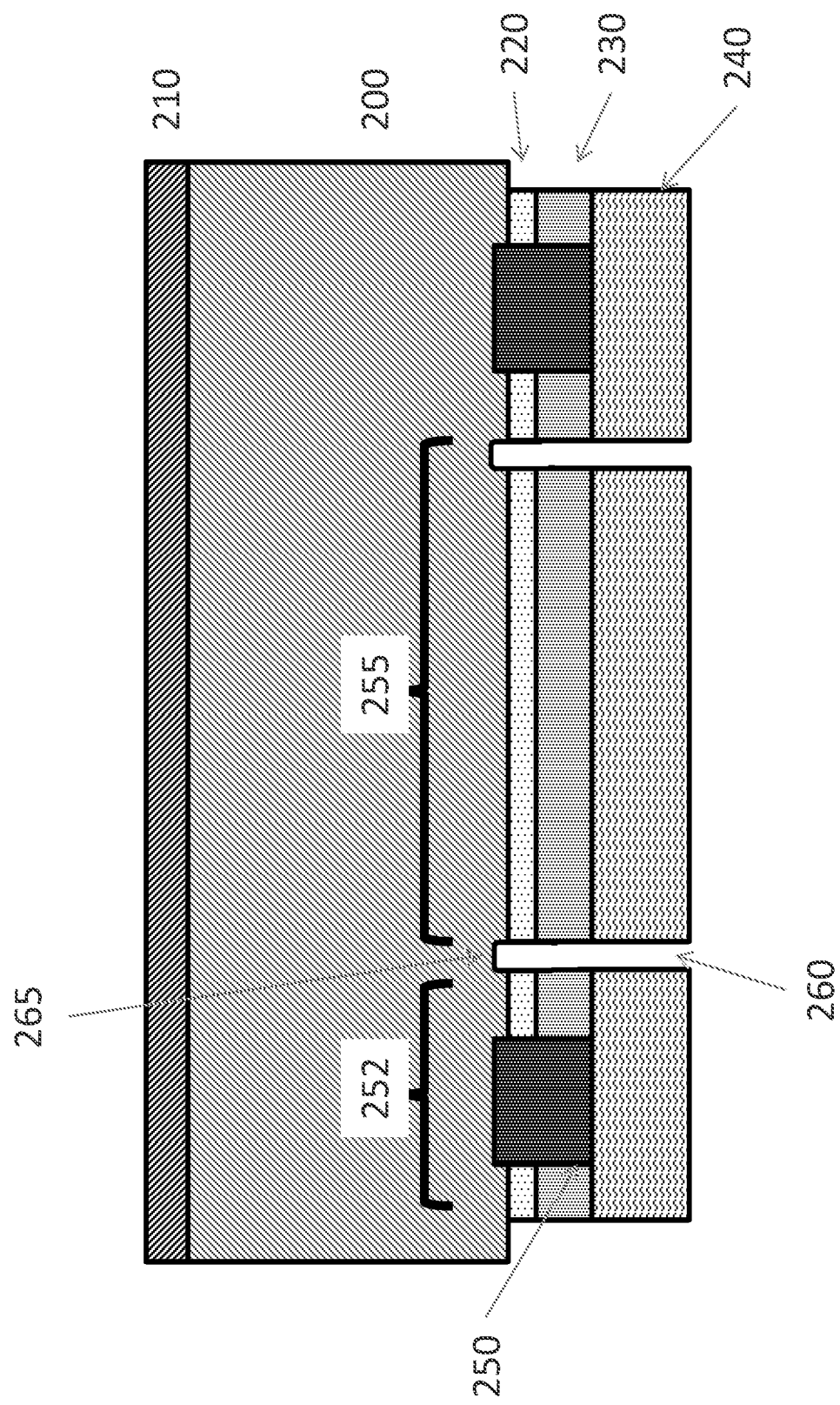
FIG. 6 is an illustrative side view of a cell structure with complete isolation of deposited layers.

FIG. 6 is an illustrative embodiment showing a side view of an embodiment of a solar cell with an IBC formed by the fabrication process discussed previously. The structure, arrangement, and process for providing the components of the solar cell may be identical or similar to the embodiments discussed above, except as discussed further below. The device shown is similar to the FIGS. 2 and 5, except that the isolation channel provided by isolation gaps (260) extends through all of the doped semiconductor layer (230), heterojunction/tunnel junction (220) layer, and optionally a small depth into the base (265) of substrate (200). In other embodiments, the isolation gap (260) may only extend partially through the heterojunction/tunnel junction layer (220). It shall be apparent that FIGS. 2, 5 and 6 show the range of depths of the isolation feature (260) that are contemplated.

Figure 7:
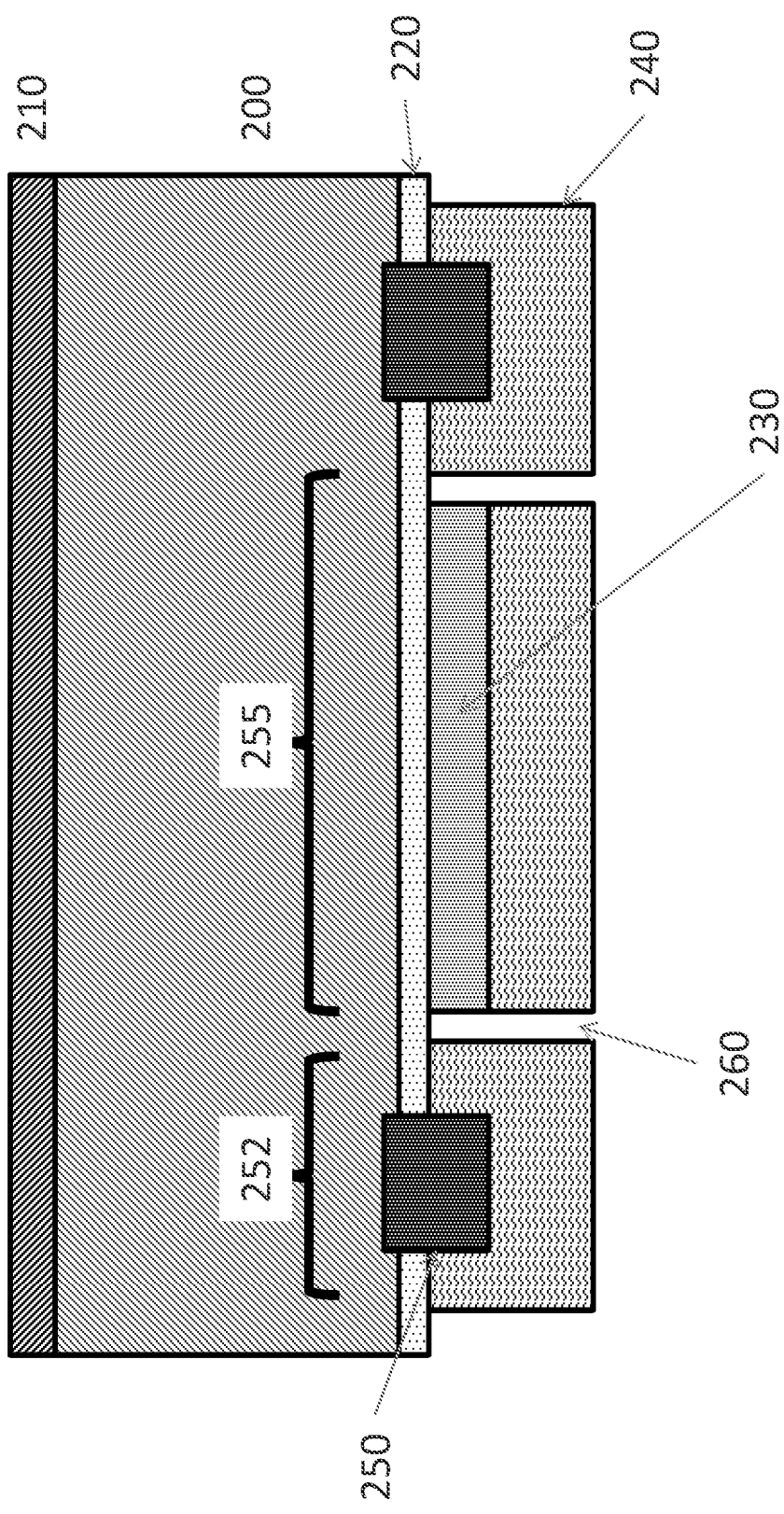
FIG. 7 is an illustrative side view of a cell structure with the semiconductor doped layer removed in the laser fired contact area.

FIG. 7 is an illustrative embodiment showing a side view of an embodiment of a solar cell with an IBC formed by the fabrication process discussed previously. The structure, arrangement, and process for providing the components of the solar cell may be identical or similar to the embodiments discussed above, except as discussed further below. The device shown is patterned prior to the deposition of the metal to substantially remove the semiconductor doped layer (230) in the region of the base contacts (252), and optionally a portion of the semiconductor doped layer in surrounding areas may also be removed. It shall be apparent that laser processed region (250) is laser processed prior to removal of a portion of the semiconductor doped layer (230) since the laser processed region extends from depth corresponding to semiconductor doped layer. The removal of the semiconductor layer (230) can include partial removal of the layer, full removal of the layer, removal of some or all of the intrinsic layer (220), and/or removal of some of the base substrate (200). In some embodiments, removal of the semiconductor doped layer (230) and optionally a portion of the intrinsic layer (220) (or heterojunction layers) in the region surrounding the laser-processed base contact (252) may be achieved during the laser processing step by choosing laser processing conditions that cause both the doped and the intrinsic layers to delaminate due to localized heating. In other embodiments, the semiconductor doped layer (230) and the intrinsic layer (220) (or heterojunction layers) in the region surrounding the laser-processed base contact (252) may be removed by other suitable means, such as etching. In other embodiments, the laser processing to form laser processed regions (250) may be performed after removal of the semiconductor doped layer (230).

In some embodiments, a passivated solar cell is provided where most of the rear surface contains a tunnel oxide emitter interspersed with parallel lines of ohmic base contacts in a finger pattern. The desired arrangement may be formed by laser ablating the tunnel oxide layer to isolate the base contact and emitter, and laser transferring a base contact finger pattern using laser beams. In one embodiment, a tunnel oxide layer is first deposited on the rear surface by atomic layer deposition, and then a thin layer of metal oxide(s) (e.g. $MoO_x$ and ZnO) are then deposited. A line-shaped laser beam is used to ablate a line region to create a gap region that provides isolation between the base contact and emitter, and then a line is laser transferred and doped in the central region (e.g. Sb) of the base contacts to create laser-processed doped regions that extend through an intrinsic layer for a heterojunction or an insulator/high band-gap layer for a tunnel junction to contact the substrate. In some embodiments, it may be possible to laser transfer the Sb under conditions that locally disrupt the tunnel oxide layers so that a separate laser ablation step is not required; thus, some embodiments may contemplate a combined laser ablation and doping step. Further, both the tunnel oxide layers and the Sb base contact may be plated with conductive material (e.g. Ni/Cu) to increase the conductivity of the contacts.

FIG. 8 is an illustrative embodiment showing a bottom view of a solar cell with an IBC formed by the fabrication process discussed previously. It shall be apparent to one of skill in the art that any of the various embodiments discussed above and illustrated with side views (e.g. FIGS. 2-7 & 10) may have the same or a similar interdigitated finger pattern as illustrated in FIG. 8. The structure, arrangement, and process for providing the components of the solar cell may be identical or similar to the embodiments discussed above. The contact metal (240) is portioned into a base finger (304) and an emitter finger (306), each having a predetermined width determined in the Y direction. In some embodiments, it is preferable that the width of the base finger or finger portion of the base contact (304) be less than the width of the emitter finger or finger portion of the emitter (306). In some embodiments, it is preferable that the emitter finger (306) comprise greater than 60% of the total area of all of the finger structures. An isolation gap (260) separates and isolates base fingers (304) from emitter fingers (306). The isolation gap (260) may be of any suitable size that is easily manufacturable. In some embodiments, it is preferably that the isolation gap be equal to or less than 200 um wide, preferably equal to or less than 100 um wide. The base laser firing region (300) illustrates laser-processed doped regions that extend through an intrinsic layer for a heterojunction or an insulator/high band-gap layer for a tunnel junction to contact the substrate. The base laser firing region (300) should be contained within the base finger so that contact metal (240) for the base finger (304) is in contact with the base laser firing region.

Figure 9A:
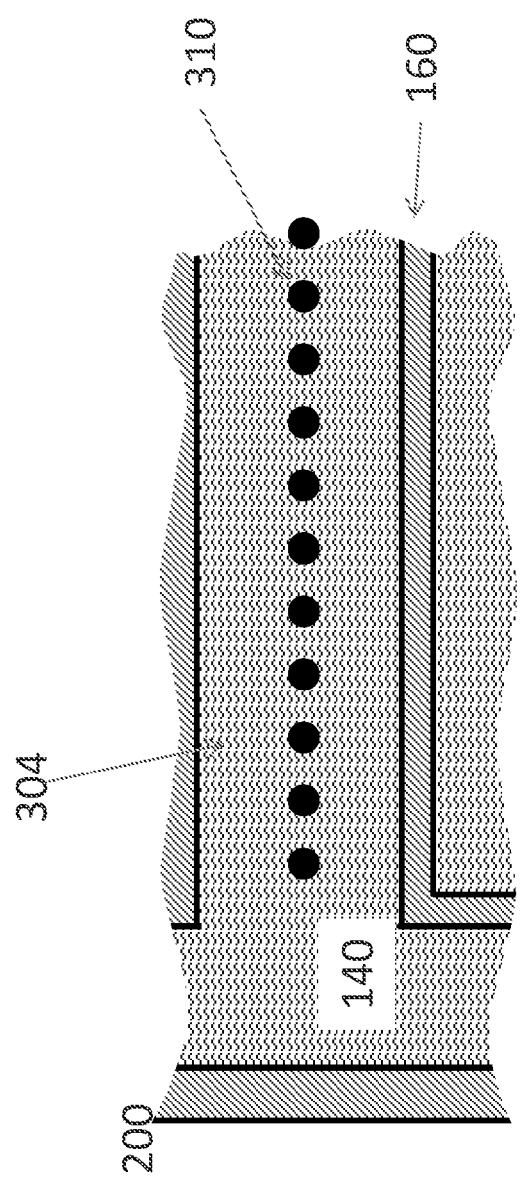
Figure 9B:
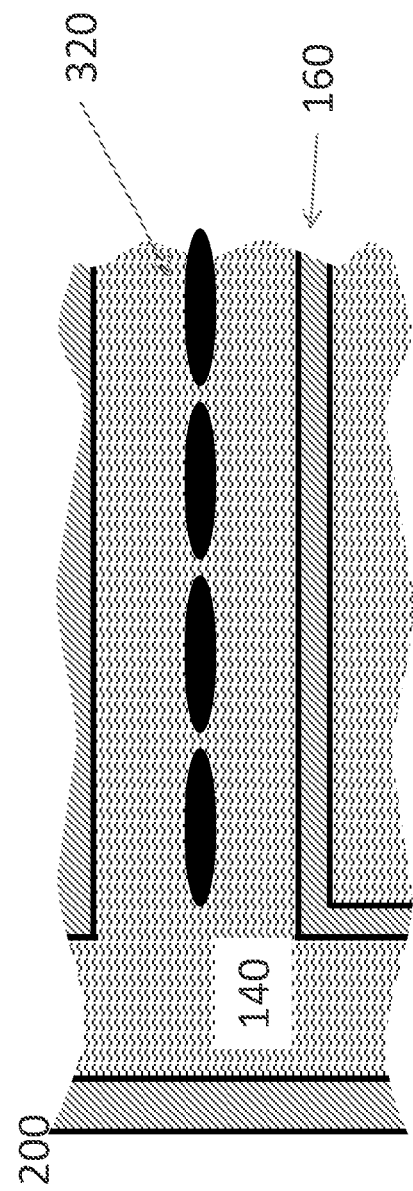

FIGS. 9a though 9d are illustrative embodiments showing a bottom view of a solar cell with an IBC formed by the fabrication process discussed previously and demonstrating different embodiments of base contact laser firing patterns. It shall be apparent to one of skill in the art that any of the various embodiments discussed above and illustrated with side views (e.g. FIGS. 2-7 & 10) may have the same or a similar interdigitated finger pattern as illustrated in FIGS. 9a-9d. The structure, arrangement, and process for providing the components of the solar cell may be identical or similar to the embodiments discussed above. FIG. 9a shows a circular beam point contact structure. FIG. 9b shows a line beam point contact structure. In some embodiments, the laser firing patterns may not overlap or provide separation between adjacent firing points. The separation between points in the circular or line beam contact structures can be equal to or less than 2 mm, preferably equal to or less than 1 mm. FIG. 9c shows a line beam line contact, in which the line beam features overlap to form a continuous line of laser firing. In some embodiments, the laser firing pattern may include more than one parallel line in the X direction. FIG. 9d shows an array of line beam point contacts with discrete spacing in both the Y and X directions. In some embodiments, the line beam point contacts may be substituted with circular beam point contact structures or overlapping line beam features to form an array. The array is preferably arranged so that each of the 'line' of contacts are parallel to each other. The separation between points in the array contacts can be equal to or less than 2 mm, preferably equal to or less than 1 mm.

While some of the embodiments discussed above reference laser processing to create point contacts through an intrinsic layer (e.g. intrinsic layer 220) of a heterojunction, in some embodiments, laser processing is used to fire $p^+$ and $n^+$ point contacts through a dielectric coating (e.g. dielectric layer 295 in FIG. 4) over a rear heterojunction or rear tunnel oxide structure. Further, another laser transfer process may then be used to deposit an interdigitated finger pattern of an appropriate metal on top of the dielectric coating and over the appropriate point contacts using a narrow laser beam. In some embodiments, the laser processing conditions could be chosen so that the laser processing disrupts the heterojunction or tunnel oxide layers in the vicinity of the base point contact, but not in the vicinity of the emitter point contacts. For example, in some embodiments, the Gaussian laser beam may be small diameter beam, such as a beam that is ≤20 µm and ≥10 µm. In another embodiment, the laser beam may be a line shaped beam with one dimension that is 20 µm or less (e.g. width of the beam) and the other dimension that is 80 µm or greater (e.g. length of the beam). An interdigitated seed layer (e.g. Ni) could be laser transferred on top of the heterojunction or tunnel oxide layers and on top of the $n^+$ and $p^+$ point contacts. In another embodiment, a finger pattern of n+ and p+ materials (e.g. Al and Sb) may be laser transferred under conditions to lay the transferred materials on top of the dielectric layers, and to then laser fire the $p^+$ and $n^+$ point contacts through the dielectric and the rear heterojunction or tunnel oxide layers. In yet another embodiment, the $n^+$ and $p^+$ point contacts may be laser transferred before forming the heterojunction or tunnel oxide junction on the wafer, then laser transferring a IBC pattern (e.g. Ni) on top of the dielectric layer over the heterojunction or tunnel oxide layers. Subsequently, the Ni may be laser fired into the point contacts. It should be noted that accurate alignment may be desirable with this approach in order to laser fire the Ni into the point contacts.

In yet another embodiment, a laser processing system is provided that utilizes either a narrow line-shaped laser beam or an array of small Gaussian laser beams (e.g. <20 µm or <10 µm), either of which can be temporally shaped, to either ablate, transfer a dopant, metal, or other material; or laser-dope or laser fire localized $p^+$ or $n^+$ contacts. This system uses the spatially shaped laser beams to transfer and laser-fire (or laser dope) both $p^+$ and $n^+$ dopants through an optional dielectric layer over a heterojunction or tunnel oxide junction to form a low-cost, high-performance, inter-digitated back-contact solar cell at low temperatures without the need for any vacuum processing equipment. The laser processing system may comprise a laser beam with a temporally adjustable pulse that is optimized to produce high quality localized emitters and base contacts. The transparent transfer substrate (e.g. a thin glass plate) is held a fixed distance from the Si wafer (e.g. 5-50 microns) and can be moved between regions containing layers of various materials, such as metals (e.g Sb, Al), dopant materials (e.g. spin-on phosphorus or boron containing inks), or no coating so that the laser can either transfer the metals or ablate a dielectric surface on the Si wafer. By designing the system with interchangeable optics, one could laser transfer and dope $p^+$ and $n^+$ point contacts and then switch to a low-power laser transfer of an interdigitated finger pattern that would lie on top of the dielectric layer over the heterojunction or tunnel oxide layers. The laser beam can be scanned across the transparent transfer substrate and the silicon wafer to form the desired contact pattern on the surface of the wafer.

Systems and methods for producing high-performance interdigitated back contact (IBC) solar cells that are fabricated at low temperatures with low manufacturing costs using a laser-transfer process are discussed herein.

Example

An n-type continuous Czochralski (CCz) silicon wafer with light phosphorous doping (2.8 Ω-cm) was etched to remove saw damage in 20 wt % KOH at 80° C. for 12 minutes. After RCA cleaning, the wafer was subjected to the following PECVD growth: (1) A layer of 10 nm of intrinsic hydrogenated amorphous silicon followed by a layer of 72 nm of silicon nitride was grown on the front surface; (2) a layer of 10 nm intrinsic hydrogenated amorphous silicon followed by 10 nm of boron doped hydrogenated amorphous silicon (2% borane dopant feed), followed with a final layer of 72 nm of silicon nitride was grown on the rear surface.

The above sample was annealed at 180° C. for 30 minutes in air in a tube furnace. An antimony donor plate comprising 50 Å of Ni followed by 2000 Å of antimony on 700 µm thick borosilicate glass was prepared. The silicon sample was laser fired by placing the antimony donor plate antimony side down on the silicon and laser firing through the antimony donor plate with a 100 ns laser pulse at 1064 nm wavelength. The laser power and focus were chosen such that the laser fire mark on the sample was about 200 µm long by approximately 10 µm wide. The firing pattern comprised laser fired features measuring 17 mm in the X direction and 50 µm in the Y direction (e.g. see FIG. 7d). The laser fired features contained individual laser line patterned spots separated by 500 micron in the X direction and 5 micron in the Y direction. These lines were placed on the sample at a 2 mm spacing in the Y direction.

Silicon nitride was then completely removed from that side of the sample, and a metal layer comprising 50 nm of Aluminum and 400 nm of silver was deposited by evaporation. Microposit s1813 positive photoresist was applied to the sample and then exposed to create the isolation line (e.g. see 260 from FIG. 9d). After development of the photoresist, the isolation was etched with PAN etch (16:1:1:2 H3PO4: HNO3:Acetic acid:Water) for 10 minutes to isolate the base and emitter contacts as defined in the structure of FIG. 2. The sample was annealed for 30 minutes at 180 C in air.

The resulting device had an active area of 2.6 cm$^2$ and was tested for IV characteristics. The solar cell displayed an open circuit voltage of 0.608V, a short circuit current of 29.3 mA/cm2, and an efficiency of 11.1%.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. A method for forming interdigitated back contacts of a solar cell, the method comprising:
   forming a heterojunction structure or a tunnel junction structure on a rear surface of a main substrate;
   maintaining a donor substrate at a distance from the main substrate;
   forming a laser processed region of a base contact on the rear surface, wherein the laser processed region of the base contact is formed by laser processing comprising a laser transfer process causing formation of a dopant on the main substrate via transfer of the dopant or a derivative thereof from the donor substrate and a laser-doping process of the dopant deposited on the main substrate causing formation of the laser processed region; and
   depositing a metal layer in an interdigitated finger pattern on the rear surface, wherein the interdigitated finger pattern provides a first set of fingers of the metal layer in electrical communication with emitter regions and a second set of fingers of the metal layer in electrical communication with the base contact, and the base contact is isolated from the emitter regions.

2. The method of claim 1, where the laser processing for the laser processed region of the base contact is a laser-firing or laser-doping process that drives a dopant through the heterojunction structure or the tunnel junction structure into the main substrate.

3. The method of claim 1, wherein the laser transfer process causes the transfer of the dopant onto base contact regions of the main substrate, and the laser-doping process causes the laser processed region to be formed by driving the dopant into and through the heterojunction structure or the tunnel junction structure to the main substrate.

4. The method of claim 1 further comprising an additional laser processing step to cause localized disruption to create an isolation gap between the base contact and the emitter regions.

5. The method of claim 1, wherein a portion of the heterojunction structure or the tunnel junction structure is removed prior to forming the laser processed region.

6. The method of claim 5, wherein the portion of the heterojunction structure or the tunnel junction structure removed is removed by laser ablation, or by delamination due to localized heating during the laser processing, or by masking and chemical etching.

7. The method of claim 5, wherein the portion of the heterojunction structure or the tunnel junction structure removed is from base contact regions of the main substrate.

8. The method of claim 5, wherein the portion of the heterojunction structure or the tunnel junction structure removed extends through the heterojunction structure or the tunnel junction structure and into a portion of the main substrate.

9. The method of claim 5, wherein the portion of the heterojunction structure or the tunnel junction structure removed is a region between the base contact and the emitter regions and provides an isolation gap between the base contact and the emitter regions.

10. The method of claim 1 further comprising the step of: applying an isolation layer on the heterojunction structure or the tunnel junction structure prior to depositing the metal, wherein the isolation layer is present between base contact regions and the emitter regions.

11. The method of claim 1 further comprising the steps of: depositing an insulating layer on a portion of the metal layer in the interdigitated finger pattern and into gaps in the metal layer between base contact regions and the emitter regions; and depositing an extra metal on the metal layer and the insulating layer, wherein the extra metal is patterned to provide base contact regions of the extra metal and emitter contact regions of the extra metal, and a base contact width of the base contact regions is approximately equal to an emitter contact width of the emitter contact regions.

12. The method of claim 1 further comprising the step of: depositing a dielectric layer on the heterojunction structure or the tunnel junction structure prior to the forming the laser processed region of the base contact, wherein at least a portion of the dielectric layer is absent from the emitter regions.

13. The method of claim 1, where the emitter regions occupy 60% or more of the rear area of the cell.

14. The method of claim 1, wherein the laser processing utilizes a spatially profiled laser beam or a temporally shaped laser beam.

15. The method of claim 1, wherein the laser processing utilizes one or an array of Gaussian beams where the Gaussian beams are circular, and where each of the Gaussian beams has a diameter of 30 microns or less.

16. The method of claim 1, wherein the laser processing utilizes a laser beam that is narrow and line-shaped, and the width of the laser beam is 20 microns or less.

17. The method of claim 1, wherein a laser beam is temporally shaped with an initial energy density over a first time period to transfer the dopant material from the donor substrate to the main substrate during the laser transfer process, and the laser beam also disrupts the heterojunction layer or the tunnel junction layer to cause delamination, the laser beam is transitioned to a second energy density that is lower that the initial energy density for a second time period to locally melt the heterojunction layer or the tunnel junction layer and to allow the dopant to diffuse into the main substrate during the laser-doping process, and the laser beam is transitioned to a third energy density that is lower than the second energy density for a third time period to anneal the localized laser-processed region.

18. The method of claim 1, wherein the laser-doping process causes localized disruption of a portion of the heterojunction structure or the tunnel junction structure and simultaneously drives the dopant through the heterojunction structure or the tunnel junction structure into the main substrate.

* * * * *